United States Patent
Yoon

(10) Patent No.: US 9,349,901 B2
(45) Date of Patent: May 24, 2016

(54) SOLAR CELL APPARATUS AND METHOD OF FABRICATING THE SAME

(71) Applicant: LG INNOTEK CO., LTD., Seoul (KR)

(72) Inventor: Hee Kyung Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 201 days.

(21) Appl. No.: 14/357,387

(22) PCT Filed: Nov. 8, 2012

(86) PCT No.: PCT/KR2012/009425
§ 371 (c)(1),
(2) Date: May 9, 2014

(87) PCT Pub. No.: WO2013/069999
PCT Pub. Date: May 16, 2013

(65) Prior Publication Data
US 2014/0318607 A1    Oct. 30, 2014

(30) Foreign Application Priority Data

Nov. 9, 2011 (KR) ................. 10-2011-0116440

(51) Int. Cl.
*H01L 31/00* (2006.01)
*H01L 31/0749* (2012.01)
*H01L 31/0216* (2014.01)

(52) U.S. Cl.
CPC ...... *H01L 31/0749* (2013.01); *H01L 31/02167* (2013.01); *Y02E 10/541* (2013.01)

(58) Field of Classification Search
CPC ................. H01L 31/0749; H01L 31/02167

USPC .......................... 136/252, 256, 260, 265, 255
See application file for complete search history.

(56) References Cited

U.S. PATENT DOCUMENTS

| | | | | |
|---|---|---|---|---|
| 4,074,305 | A | * | 2/1978 | Johnston, Jr. ...... H01L 21/28581 136/256 |
| 4,108,684 | A | * | 8/1978 | Zanio .................. H01L 31/0368 136/258 |
| 6,040,521 | A | * | 3/2000 | Kushiya .......... H01L 31/022466 136/252 |
| 2008/0110498 | A1 | * | 5/2008 | Zafar ............. H01L 31/022425 136/260 |
| 2008/0135083 | A1 | | 6/2008 | Lai et al. |
| 2011/0197967 | A1 | | 8/2011 | Kaijo et al. |

FOREIGN PATENT DOCUMENTS

| | | |
|---|---|---|
| CN | 101197398 A | 6/2008 |
| CN | 102187472 A | 9/2011 |
| KR | 10-2011-0001813 A | 1/2011 |

(Continued)

OTHER PUBLICATIONS

International Search Report in International Application No. PCT/KR2012/009425, filed Nov. 8, 2012.

(Continued)

*Primary Examiner* — Allison Bourke
(74) *Attorney, Agent, or Firm* — Saliwanchik, Lloyd & Eisenschenk

(57) ABSTRACT

A solar cell apparatus according to the embodiment includes a support substrate; a back electrode layer on the support layer; a light absorbing layer on the back electrode layer; a first buffer layer having first conductivity on the light absorbing layer; a second buffer layer having second conductivity on the first buffer layer; and a window layer on the second buffer layer.

8 Claims, 1 Drawing Sheet

(56) References Cited

FOREIGN PATENT DOCUMENTS

| KR | 10-2011-0036153 A | 4/2011 |
| KR | 10-2011-0048262 A | 5/2011 |

OTHER PUBLICATIONS

Office Action dated Aug. 12, 2015 in Chinese Application No. 201280066596.4.

\* cited by examiner

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/009425, filed Nov. 8, 2012, which claims priority to Korean Application No. 10-2011-0116440, filed Nov. 9, 2011, the disclosures of each of which are incorporated herein by reference in their entirety.

TECHNICAL FIELD

The embodiment relates to a solar cell apparatus and a method of fabricating the same.

BACKGROUND ART

A solar cell (or photovoltaic cell) is a core element in solar power generation to directly convert solar light into electricity.

For example, if the solar light having energy greater than bandgap energy of a semiconductor is incident into a solar cell having the PN junction structure, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

Recently, as energy consumption is increased, solar cells to convert the solar light into electrical energy have been developed.

In particular, a CIGS-based solar cell, which is a PN hetero junction apparatus having a substrate structure including a glass substrate, a metallic back electrode layer, a P-type CIGS-based light absorbing layer, a high-resistance buffer layer, and an N-type window layer, has been extensively used.

Various studies and researches have been performed to improve electrical characteristics of the solar cell, such as low resistance and high transmittance.

Since CdS has a bandgap between those of the P-type CIGS-based light absorbing layer and the N-type window layer and represents superior electrical characteristics, the CdS has been extensively used for the high-resistance buffer layer. However, since the bandgap of the CdS is relatively fixed, the CdS is disadvantageous to form a buffer layer having a wide bandgap.

In addition, since the CdS has the n-type electrical characteristics, techniques for improving the electrical characteristics by forming a P-type buffer layer on the P-type CIGS-based light absorbing layer are requested.

DISCLOSURE OF INVENTION

Technical Problem

The embodiment provides a solar cell apparatus which includes a first buffer layer having first conductivity and a second buffer layer having second conductivity formed on a light absorbing layer in order to improve coverage of the buffer layer, so that electrical characteristics of the solar cell may be improved.

Solution to Problem

According to the embodiment, there is provided a solar cell apparatus including a support substrate; a back electrode layer on the support layer; a light absorbing layer on the back electrode layer; a first buffer layer having first conductivity on the light absorbing layer; a second buffer layer having second conductivity on the first buffer layer; and a window layer on the second buffer layer.

Advantageous Effects of Invention

As described above, according to the embodiment, the solar cell apparatus includes the first buffer layer having the first conductivity and the second buffer layer having the second conductivity formed on the light absorbing layer, so that the coverage of the buffer layer may be improved. Accordingly, the electrical characteristics of the solar cell apparatus can be improved.

BEST MODE FOR CARRYING OUT THE INVENTION

Figure 1:
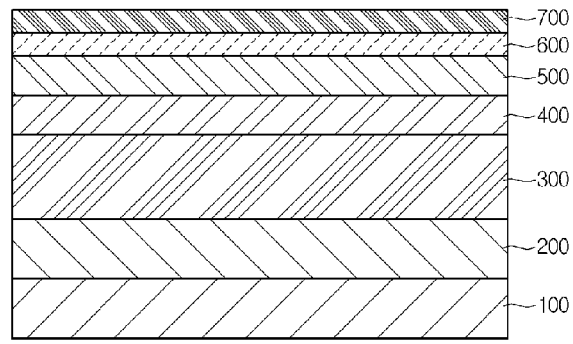
FIG. 1 is a sectional view showing a solar cell apparatus according to the embodiment.

In the description of the embodiments, it will be understood that when a substrate, a layer, a film or an electrode is referred to as being on or under another substrate, another layer, another film or another electrode, it can be directly or indirectly on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIG. 1 is a sectional view showing a solar cell apparatus according to the embodiment. Referring to FIG. 1, the solar cell panel includes a support substrate 100, a back electrode layer 200, a light absorbing layer 300, a first buffer layer 400, a second buffer layer 500, a high-resistance buffer layer 600, and a window layer 700.

The support substrate 100 has a plate shape and supports the back electrode layer 200, the light absorbing layer 300, the first buffer layer 400, the second buffer layer 500, the high-resistance buffer layer 600, and window layer 700.

The support substrate 100 may be an insulator. The support substrate 100 may be a glass substrate, a plastic substrate such as polymer or a metal substrate. In addition, the support substrate 100 may be a ceramic substrate including alumina, stainless steel, or polymer having a flexible property. The support substrate 100 may be transparent and, rigid or flexible.

If the substrate 100 includes a soda lime glass substrate, sodium (Na) contained in the soda lime glass may be diffused into the light absorbing layer 300 including CIGS during the process of fabricating the solar cell. Accordingly, the concentration of charges of the light absorbing layer 30 may be increased, thereby increasing the photoelectric conversion efficiency of the solar cell.

The back electrode layer 200 is provided on the substrate 100. The back electrode layer 200 is a conductive layer. The back electrode layer 200 transfers charges produced in the light absorbing layer 300 of the solar cell, thereby allowing current to flow to the outside of the solar cell. The back electrode layer 200 must represent higher electric conductivity and lower resistivity in order to perform the above function.

In addition, the back electrode layer 200 must maintain high-temperature stability when heat treatment is performed under the atmosphere of sulfur (S) or selenium (Se) required when a CIGS compound is formed. In addition, the back electrode layer 200 must represent a superior adhesive property with respect to the substrate 100 such that the back electrode layer 200 is prevented from being delaminated from the substrate 100 due to the difference in the thermal expansion coefficient between the back electrode layer 200 and the substrate 100.

The back electrode layer 200 may include any one of molybdenum (Mo), gold (Au), aluminum (Al), chrome (Cr), tungsten (W), and copper (Cu). Among them, Mo makes the lower difference in the thermal expansion coefficient from the substrate 100 when comparing with the other elements, so that the Mo represents a superior adhesive property, thereby preventing the above de-lamination phenomenon, and totally satisfying the characteristic required for the back electrode layer 200. The back electrode layer 200 may have a thickness in the range of 400 to 1000.

The light absorbing layer 300 may be formed on the back electrode layer 200. The light absorbing layer 300 includes a P-type semiconductor compound. In more detail, the light absorbing layer 300 includes a group I-III-VI-based compound. For example, the light absorbing layer 300 may have a $Cu(In,Ga)Se_2$ (CIGS) crystal structure, a $Cu(In)Se_2$ crystal structure, or a $Cu(Ga)Se2$ crystal structure.

When the light absorbing layer 300 is formed in the $Cu(In,Ga)Se_2$ (CIGS) crystal structure, the light absorbing layer 300 may be formed as the chemical formula of $Cu(In_xGa_{(1-x)})Se$, where x may be formed at a thickness in the range of 0 to 0.3.

The light absorbing layer 300 may have an energy bandgap in the range of 1.1 eV to 1.2 eV, and a thickness in the range of 1.5 to 2.5.

The first buffer layer 400 having the first conductivity is provided on the light absorbing layer 300. According to the solar cell having the light absorbing layer 300 including the CIGS compound, a P-N junction is formed between a CIGS compound thin film, which serves as a P-type semiconductor, and the window layer 50 which is an N-type semiconductor. However, since two materials represent the great difference in the lattice constant and the bandgap energy therebetween, a buffer layer having the intermediate bandgap between the bandgaps of the two materials is required to form the superior junction between the two materials.

According to the embodiment, the first buffer layer 400 having the first conductivity is formed on the light absorbing layer 300. The first buffer layer 400 may have the same conductivity as that of the light absorbing layer 300. That is, the first buffer layer 400 may have P-type conductivity. For example, the first buffer layer 400 may include InP. The first buffer layer 400 including InP may have an energy bandgap in the range of 1.2 eV to 1.4 eV, and a thickness in the range of 30 to 80.

The second buffer layer 500 having the second conductivity may be formed on the first buffer layer 400. The second buffer layer 500 may have the same conductivity as that of the window layer 700. That is, the second buffer layer 500 may have N-type conductivity. For example, the second buffer layer 500 may include CdS. The second buffer layer 500 including CdS may have the energy bandgap of 2.4 eV, and a thickness in the range of 20 to 80.

Due to the first buffer layer 400 formed on the light absorbing layer 300, the transmittance may be increased so that Isc may be improved. Accordingly, the fill factor may be improved.

The high-resistance buffer layer 600 may be disposed on the second buffer layer 500. The high-resistance buffer layer 500 may include i-ZnO, which is zinc oxide not doped with impurities. The high-resistance buffer layer 500 may have an energy bandgap in the range of about 3.1 eV to about 3.3 eV and a thickness in the range of 50 o 60.

The window layer 700 is disposed on the high-resistance buffer layer 500. The window layer 700 is transparent and a conductive layer. The resistance of the window layer 700 is higher than that of the back electrode layer 200.

The window layer 700 includes oxide. For example, the window layer 700 may include zinc oxide, indium tin oxide (ITO), or indium zinc oxide (IZO).

In addition, the window layer 700 may include Al doped zinc oxide (AZO) or Ga doped zinc oxide (GZO). The window layer 700 may be formed at a thickness in the range of 800 to 1000.

According to the embodiment, the solar cell apparatus includes the first buffer layer having the first conductivity and the second buffer layer having the second conductivity formed on the light absorbing layer, so that the absorption rate of light incident into the solar cell apparatus may be improved, so the electrical characteristics of the solar cell apparatus may be improved.

FIGS. 2 to 5 are sectional views illustrating a procedure of fabricating a solar cell panel according to the embodiment. The description of the present fabricating method will be made by making reference to the above description of the solar cell. The above description of the solar cell may be incorporated with the description of the present fabricating method.

Figure 2:
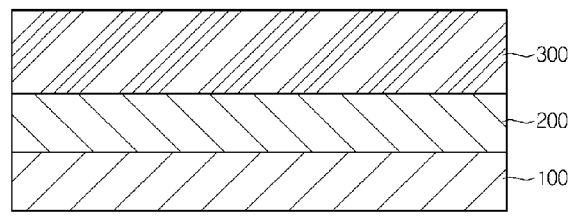
FIGS. 2 to 5 are sectional views illustrating a procedure of fabricating a solar cell panel according to the embodiment.

Referring to FIG. 2, the back electrode layer 200 is formed on the substrate 100. The back electrode layer 200 may be formed by depositing Mo. The back electrode layer 200 may be formed through a sputtering scheme. In addition, an additional layer such as an anti-diffusion layer may be interposed between the substrate 100 and the back electrode layer 200.

Then, the light absorbing layer 300 is formed on the back electrode layer 200. The light absorbing layer 300 is formed by extensively using schemes, such as a scheme of forming a $Cu(In,Ga)Se_2$ (CIGS) based-light absorbing layer 300 by simultaneously or separately evaporating Cu, In, Ga, and Se and a scheme of performing a selenization process after a metallic precursor film has been formed.

To the contrary, the sputtering process and the selenization process of using targets of Cu, In and Ga may be simultaneously performed. The CIS or CIG based light absorbing layer 300 may be formed through the sputtering process and the selenization process using only the Cu and In targets or the Cu and Ga targets.

Figure 3:
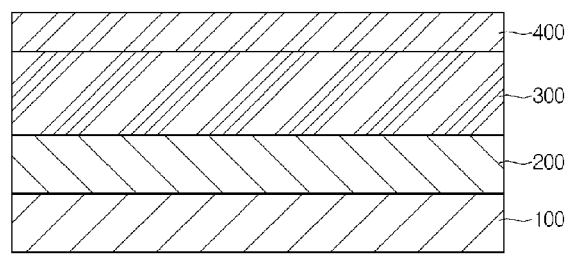

Referring to FIG. 3, the first buffer layer 400 is formed on the light absorbing layer 300. The first buffer layer 400 may include InP and may be formed through MOCVD or a sputtering scheme.

Figure 4:
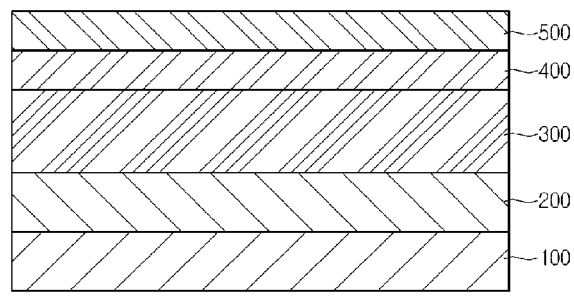

Referring to FIG. 4, the second buffer layer 500 is formed on the first buffer layer 400. The second buffer layer 500 may include CdS and may be formed through heat treatment method using CBD and $H_2S/H_2Se$.

Figure 5:
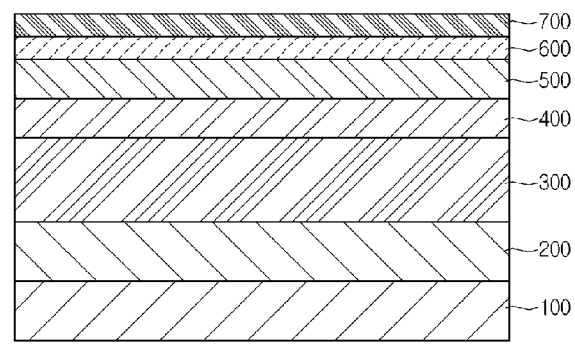

Referring to FIG. 5, the high-resistance buffer layer 600 may be formed on the second buffer layer 500. The high-resistance buffer layer 500 may include i-ZnO, which is zinc oxide not doped with impurities. Then, the window layer 700 is formed on the high-resistance buffer layer 600. In addition, the window layer 700 may be formed on the high-resistance buffer layer 600 by depositing a transparent conductive material such as Al doped zinc oxide (AZO) through a sputtering scheme.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.In addition to variations and modifications in the component parts and/or arrangements, alternative uses will also be apparent to those skilled in the art.

The invention claimed is:
1. A solar cell apparatus comprising:
a support substrate;
a back electrode layer on the support layer;
a light absorbing layer comprising copper indium gallium selenide (CIGS) on the back electrode layer;
a first buffer layer having first conductivity comprising idium phosphide (InP) on the light absorbing layer;
a second buffer layer having second conductivity comprising cadmium sulfide (CdS) on the first buffer layer; and
a window layer on the second buffer layer.
2. The solar cell apparatus of claim 1, wherein the first buffer layer has an energy bandgap in a range of 1.2 eV to 1.4 eV.
3. The solar cell apparatus of claim 1, wherein the first buffer layer has a thickness in a range of 30 nm to 80 nm.
4. The solar cell apparatus of claim 1, wherein the second buffer layer has a thickness in a range of 20 nm to 80 nm.
5. The solar cell apparatus of claim 1, the first buffer layer has the same conductivity as that of the light absorbing layer.
6. The solar cell apparatus of claim 1, the second buffer layer has the same conductivity as that of the window layer.
7. The solar cell apparatus of claim 1, a high-resistance buffer layer disposed on the second buffer layer.
8. The solar cell apparatus of claim 1, wherein the second buffer layer has an energy bandgap of 2.4 eV.

* * * * *